(12) United States Patent
Huang

(10) Patent No.: US 12,094,821 B2
(45) Date of Patent: Sep. 17, 2024

(54) METHODS FOR FORMING SEMICONDUCTOR STRUCTURES

(71) Applicant: Winbond Electronics Corp., Taichung (TW)

(72) Inventor: Chia-Hsin Huang, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 18/467,482

(22) Filed: Sep. 14, 2023

(65) Prior Publication Data

US 2023/0420365 A1 Dec. 28, 2023

Related U.S. Application Data

(62) Division of application No. 17/214,467, filed on Mar. 26, 2021, now Pat. No. 11,791,261.

(30) Foreign Application Priority Data

Apr. 14, 2020 (TW) .................................. 109112504

(51) Int. Cl.
*H01L 23/528* (2006.01)
*H01L 21/3213* (2006.01)
(Continued)

(52) U.S. Cl.
CPC .... *H01L 23/5283* (2013.01); *H01L 21/32134* (2013.01); *H01L 21/76804* (2013.01);
(Continued)

(58) Field of Classification Search
CPC ......... H01L 21/76843; H01L 21/76885; H01L 21/32134; H01L 23/5283; H01L 23/5226; H01L 29/41725; H01L 29/41766
See application file for complete search history.

(56) References Cited

U.S. PATENT DOCUMENTS 10,236,213 B1   3/2019  Pandey et al.
10,312,188 B1   6/2019  Srivastava et al.
(Continued)

FOREIGN PATENT DOCUMENTS

| CN | 111048486 A | 4/2020 |
| KR | 10-2005-0090913 A | 9/2005 |
| TW | 201032370 A | 9/2010 |

OTHER PUBLICATIONS

Office Action dated Apr. 28, 2023 issued in corresponding China Patent Application No. 202010377258.9, 8 pages.

*Primary Examiner* — Joseph C. Nicely
(74) *Attorney, Agent, or Firm* — MUNCY, GEISSLER, OLDS & LOWE, P.C.

(57) ABSTRACT

A method for forming a semiconductor structure are provided. The method includes forming a dielectric layer on a substrate; forming a contact in the dielectric layer; recessing the dielectric layer so that the upper portion of the contact protrudes from the upper surface of the dielectric layer; and etching the upper portion of the contact to reduce the size of the upper portion of the contact. The semiconductor structure includes a substrate, a contact on the substrate and having an upper portion and a lower portion, a liner on the sidewall and bottom of the lower portion of the contact, and a dielectric layer surrounding the contact. The dielectric layer is in direct contact with the sidewall of the upper portion of the contact.

13 Claims, 6 Drawing Sheets

(51) Int. Cl.
  *H01L 21/768* (2006.01)
  *H01L 23/522* (2006.01)
  *H01L 29/417* (2006.01)
  *H01L 29/40* (2006.01)
  *H01L 29/423* (2006.01)

(52) U.S. Cl.
  CPC .... *H01L 21/76843* (2013.01); *H01L 23/5226* (2013.01); *H01L 29/41725* (2013.01); *H01L 29/401* (2013.01); *H01L 29/41766* (2013.01); *H01L 29/4236* (2013.01)

(56) References Cited

U.S. PATENT DOCUMENTS

| | | |
|---|---|---|
| 10,388,771 B1 | 8/2019 | Lin et al. |
| 11,569,128 B2 | 1/2023 | Lee et al. |
| 2004/0227242 A1 | 11/2004 | Noguchi et al. |
| 2010/0213432 A1* | 8/2010 | Chuang ............... H10N 70/8413 438/54 |
| 2016/0049332 A1* | 2/2016 | Xie ....................... H01L 23/535 257/288 |
| 2016/0190062 A1* | 6/2016 | Zheng ................. H01L 23/5226 257/774 |
| 2017/0018628 A1 | 1/2017 | Greene et al. |
| 2018/0061752 A1 | 3/2018 | Huang et al. |
| 2019/0385896 A1* | 12/2019 | Chiang ............... H01L 23/5226 |
| 2021/0035907 A1 | 2/2021 | Chen et al. |
| 2021/0057569 A1 | 2/2021 | Huang et al. |
| 2021/0134671 A1 | 5/2021 | Xie et al. |
| 2021/0193189 A1* | 6/2021 | Ahmed ............... H01L 23/5329 |
| 2021/0225701 A1 | 7/2021 | Wang et al. |
| 2021/0226057 A1 | 7/2021 | Chu et al. |
| 2022/0254804 A1 | 8/2022 | Yoshida |
| 2022/0399227 A1 | 12/2022 | Chiang et al. |

\* cited by examiner

METHODS FOR FORMING SEMICONDUCTOR STRUCTURES

CROSS REFERENCE TO RELATED APPLICATIONS

This application is a Division of Application Ser. No. 17/214,467, filed Mar. 26, 2021, the entirety of which is incorporated by reference herein.

BACKGROUND

Technical Field

The present disclosure relates to semiconductor structure, and in particular it relates to contacts and methods for forming the same.

Description of the Related Art

The semiconductor integrated circuit industry has experienced rapid growth. The development of technology used in the design and materials of integrated circuits has produced several generations of such integrated circuits, each of which has become smaller and more complex than the previous generations. In the course of the development of integrated circuits, the geometric dimensions are gradually shrinking.

With the scaling down of the size of semiconductor devices, the difficulty of manufacturing semiconductor elements has also greatly increased. Especially in the semiconductor process, when the conductive layer is formed on the contact, the conductive layer may easily shift due to under exposure, warpage on the wafer, and the like. In other words, in the actual manufacturing process, the conductive layer and the contact may be misaligned. In such cases, the problem of short-circuit is easily happened between contact and adjacent conductive layer due to they are too closer. Therefore, the process for forming the contact still needs further improvements to avoid short-circuiting.

BRIEF SUMMARY

In accordance with some embodiments of the present disclosure, a method for forming the semiconductor structure is provided. The method includes forming a dielectric layer on a substrate; forming a contact in the dielectric layer; recessing the dielectric layer so that the upper portion of the contact protrudes from the upper surface of the dielectric layer; and etching the upper portion of the contact to reduce the size of the upper portion of the contact.

BRIEF DESCRIPTION OF THE DRAWINGS

The disclosure can be more fully understood from the following detailed description when read with the accompanying figures. It is worth noting that, in accordance with standard practice in the industry, various features are not drawn to scale. In fact, the dimensions of the various features may be arbitrarily increased or reduced for clarity of discussion.

DETAILED DESCRIPTION

In the semiconductor process, when the conductive layer is formed on the contact, the conductive layer is easily shifted due to under exposure, warpage on the wafer and the like. In other words, in the actual process, the conductive layer and the contact are misaligned. In this case, the problem of short-circuit is easily happened between contact and adjacent conductive layer due to they are too closer.

To solve the above problem, the contact of the semiconductor structure provided by the present disclosure has a smaller top width to provide a larger process window, thereby improving process yield and ensuring the performance of semiconductor devices.

FIGS. 1-7 and 10-12 illustrate cross-sectional views of a semiconductor structure according to some embodiments of the present disclosure.

Figure 1:
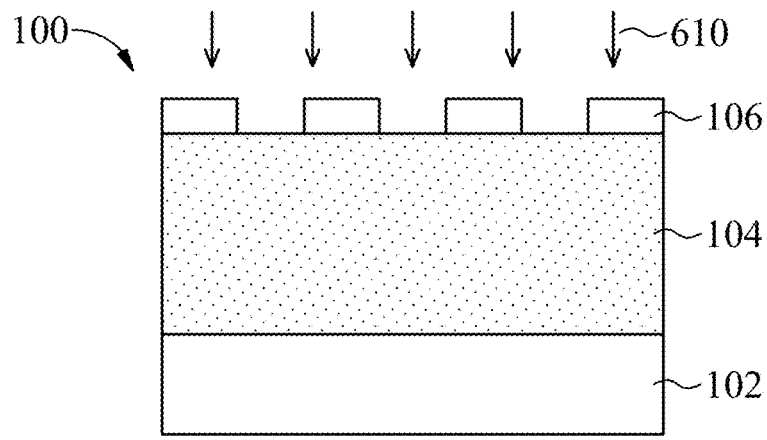
FIGS. 1-7 illustrate cross-sectional views of a semiconductor structure according to some embodiments of the present disclosure.

Referring to FIG. 1, a dielectric layer 104 is formed on a substrate 102. In some embodiments, the dielectric layer 104 may serve as an inter-layer dielectric (ILD) layer in the front-end process. In other embodiments, the dielectric layer 104 may serve as an inter-metal dielectric layer in the back-end process.

In some embodiments, the dielectric layer 104 may be formed by one or more dielectric materials, such as silicon nitride, silicon oxynitride, phosphosilicate glass (PSG), borophosphosilicate glass (BPSG), undoped silicate glass (USG), tetraethylorthosilicate (TEOS), low dielectric constant dielectric materials and/or other suitable dielectric materials and the like.

Figure 2:
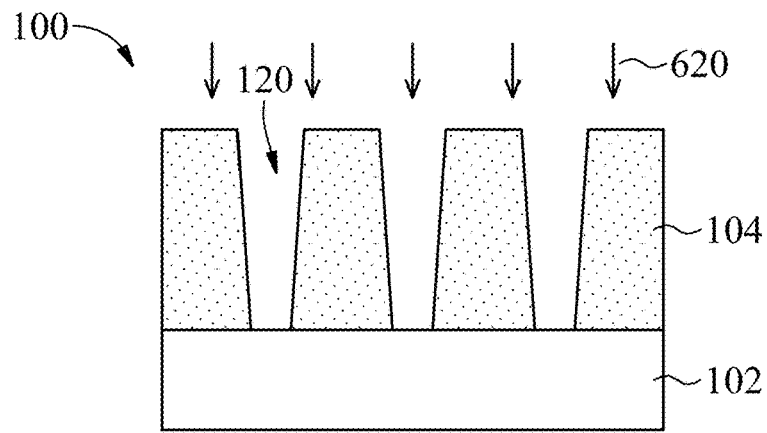

Next, still referring to FIG. 1, a patterned mask 106 is formed on the dielectric layer 104. Next, an etching process 610 is performed to form a contact hole 120 in the dielectric layer 104 by using the patterned mask 106 serving as an etching mask and then the patterned mask 106 is removed, as shown in FIG. 2. In a top view, the contact hole 120 is a hole surrounded by the dielectric layer 104 (not shown). In some embodiments, the etching process 610 may be anisotropic etching process comprising various dry etching processes.

Figure 3:
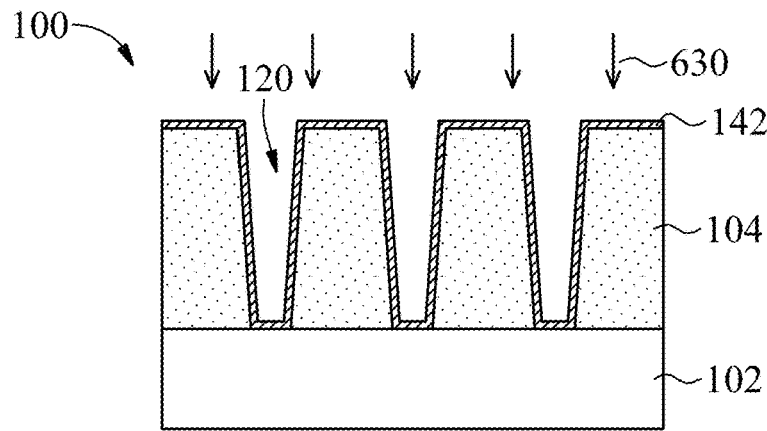

Next, a deposition process 620 is performed to conformally deposit a liner 142 in the contact hole 120 and on the dielectric layer 104 as shown in FIG. 3. In some embodiments, the liner 142 may include metal, metal alloy, metal nitride, other conductive materials or the combination thereof. Specifically, the liner 142 may include titanium (Ti), tantalum (Ta), titanium nitride (TiN), tantalum nitride (TaN), another suitable material, or a combination thereof.

Figure 4:
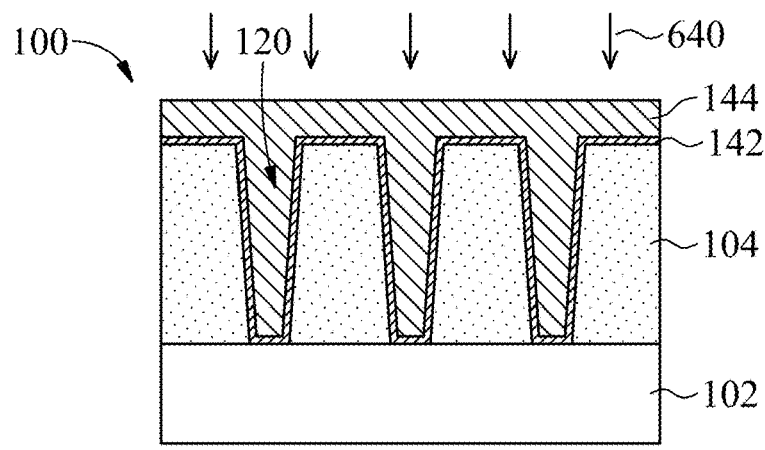

Next, a deposition process 630 is performed to deposit a conductive material 144 in the contact hole 120 and on the dielectric layer 104, as shown in FIG. 4. Specifically, the conductive material 144 is deposited on the liner 142. In some embodiments, the conductive material 144 may include metal such as tungsten, aluminum, copper, gold, silver, other suitable metal materials or the combination thereof or the like.

Excessively high resistance or even explosions may easily occur when the conductive material 144 is deposited directly on the substrate 102. Thus, in some embodiments, the liner 142 formed between the conductive material 144 and the substrate 102 may prevent the conductive material 144 from contacting the substrate 102 directly, so that an increase of resistance and thus a decrease of yield are avoided. In other respects, the liner 142 formed between the conductive material 144 and the dielectric layer 104 may prevent conductive material 144 from diffusing to the dielectric layer 104.

Figure 5:
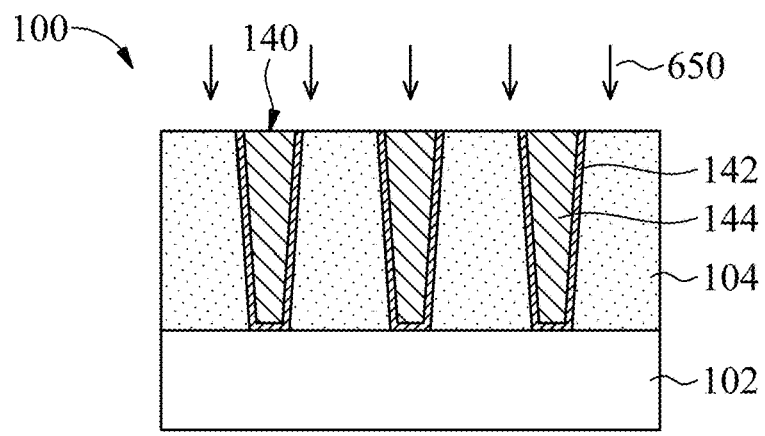

Next, a planarization process 640 is performed to remove the conductive material 144 besides the contact hole 120 and the conductive material 144 remaining in the contact hole 120 serves as a contact 140, as shown in FIG. 5. Specifically, the planarization process 640 include the removal of the liner 142 and the conductive material 144 on the dielectric layer 104, so that the upper surface of the contact 140 is level with the dielectric layer 104. In some embodiments, the planarization 640 includes chemical mechanical polishing (CMP).

Figure 6:
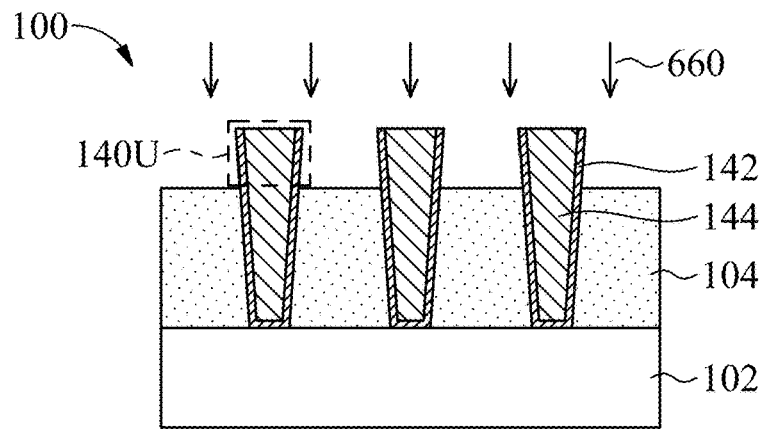

Next, an etching process 650 is performed to recess the dielectric 104, so that the upper portion 140U of the contact 140 protrudes from the upper surface of the dielectric layer 104, as shown in FIG. 6. In this embodiment, the etching process 650 is similar to the etching process 610 and thus the details are not described again herein to avoid repetition. It should be noted that the upper portion 140U of the contact 140 is above the upper surface of the dielectric layer 104 while the lower portion of the contact 140 is below the upper surface of the dielectric layer 104.

Figure 7:
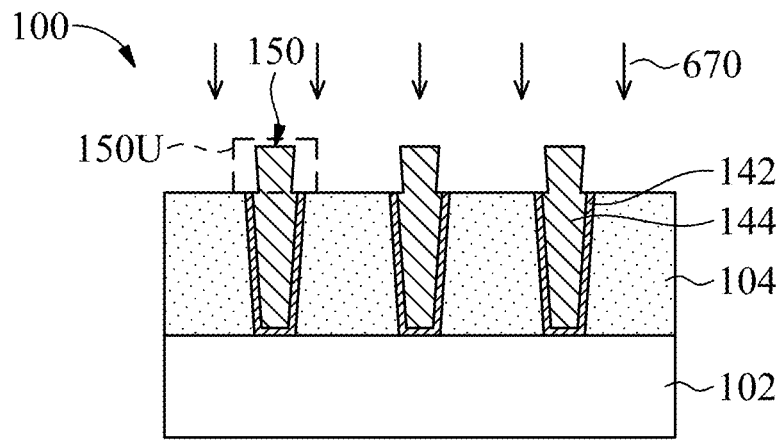

Next, an etching process 660 is performed to etch the upper portion 140U of the contact 140, thereby reducing the size of the upper portion 140U of the contact 140 and forming a desirable contact 150, as shown in FIG. 7. In some embodiments, the etching process 660 includes isotropic etching process. There are several types of etching processes, including a wet etching process, a dry etching process, another suitable etching process, and combinations thereof. In some embodiments, the step of etching the upper portion 140U of the contact 140 includes the etching sidewalls and the top surface of the upper portion 140U of the contact 140 to equally reduce the height and the width of opposite sides of the upper portion 140U, and thus form the upper portion 150U of the contact 150. In some embodiments, the etching process 660 includes etching the liner 142 and the partial conductive material 144 of the upper portion 140U of the contact 140.

Figures 8, 9:
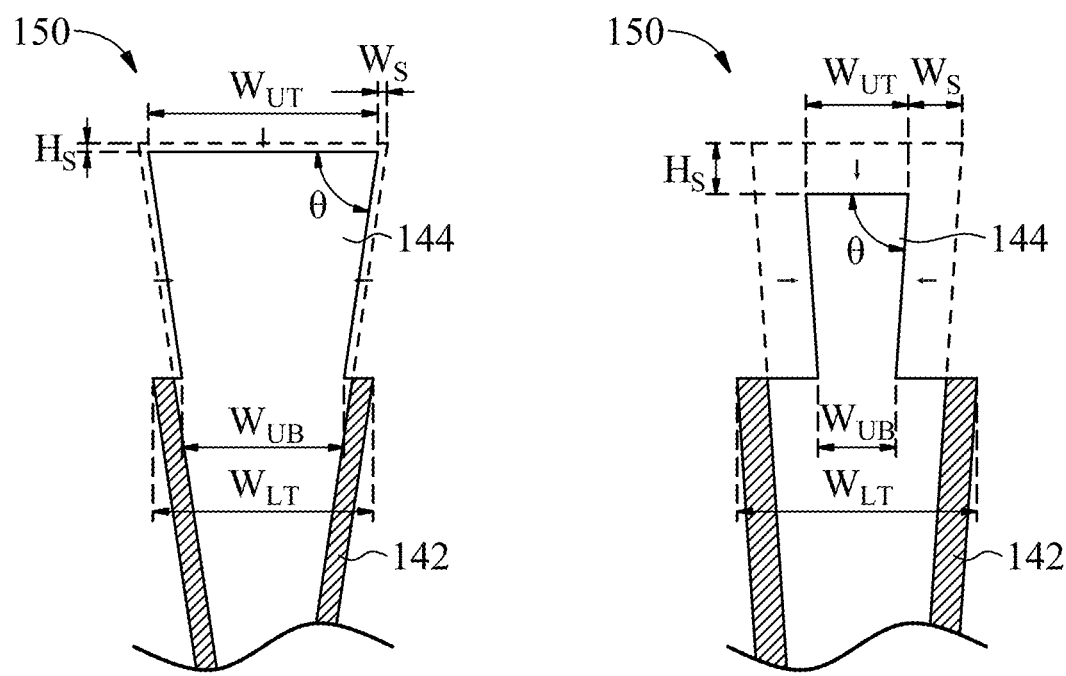
FIGS. 8-9 illustrate enlarged cross-sectional views of a partial semiconductor structure according to some embodiments of the present disclosure.

FIGS. 8-9 illustrate enlarged cross-sectional views of the contact 150 of the semiconductor structure 100 according to some embodiments of the present disclosure. In this embodiment, the liner 142 is on sidewalls of the lower portion of the contact 150 but is not on the sidewalls of the upper portion of the contact 150. In this embodiment, the upper portion and the lower portion both taper toward the substrate 102. It should be noted that the profile of the contact 140 before isotropic etching process is shown as a dashed line while the profile of the contact 150 after the isotropic etching process is shown as a solid line to illustrate the relationship before and after the size reduction of the contact. In addition, in order to depict figures clearly, the drawing symbols of the conductive material 144 and the liner 142 in FIGS. 8-9 are different from the drawing symbols of the conductive material 144 and the liner 142 in FIGS. 1-7 and 10-12.

In the embodiment of FIG. 8, each of the sidewalls of the upper portion of the contact 140 are reduced by the width $W_S$, respectively, and the top surface of the upper portion of the contact 140 is reduced by the height $H_S$ to form the contact 150. In this embodiment, the reduced width $W_S$ and the reduced height $H_S$ are substantially the same. For example, the reduced width $W_S$ is 10 nm while the reduced height $H_S$ may be 9-11 nm. In other words, being substantially the same may include an error within ±10%. In the embodiment of FIG. 8, the upper portion of the contact 150 has a top width $W_{UT}$ and a bottom width $W_{UB}$ while the lower portion of the contact 150 has a top width $W_{LT}$. In this embodiment, the upper portion of the contact 150 tapers toward the substrate 102. Thus, it may be observed that the top width $W_{UT}$ of the upper portion of the contact 150 is greater than the bottom width $W_{UB}$ of the upper portion of the contact 150. On the other hand, the etching process 660 used to reduce the top width $W_{UT}$ of the upper portion of the contact 150 may also reduce the bottom width $W_{UB}$ of the upper portion of the contact 150. Thus, it may be observed that the bottom width $W_{UB}$ of the upper portion of the contact 150 is smaller than the top width $W_{LT}$ of the lower portion of the contact 150. In other words, the sidewalls of the upper portion of the contact 150 connect the sidewalls of the lower portion of the contact 150 by the top surface of the lower portion of the contact 150.

In some embodiments, the sidewalls of the upper portion of the contact 150 are substantially parallel to the sidewalls of the lower portion of the contact 150. For example, an angle formed between the sidewall of the lower portion of the contact 150 and the substrate 102 is 70°, and an angle formed between the sidewall of the upper portion of the contact 150 is about 67°-73°. In other words, being substantially parallel may include an error within ±5%.

In some embodiments, an angle formed between the sidewall of the upper portion of the contact 150 and the top surface of the upper portion of the contact 150 is about 60°-90°. The process causes the contact 150 to taper toward the substrate 102. Thus, the angle θ formed between the sidewall and the top surface of the upper portion of the contact is generally less than 90°. On the other hand, if the angle is less than 60°, a wider top width might be formed, thereby reducing the process window.

In some embodiments, the ratio of the total reduced width $2W_S$ of the contact 140 to the original total width $W_{UT}+2W_S$ of the upper portion of the contact 140 is not greater than 50%. When the ratio is greater than 50%, the contact area of the contact and the subsequent conductive layer becomes smaller, and thus the contact resistance increases easily, thereby reducing the performance of the semiconductor device.

In the embodiment of FIG. 8, the top width WIT of the upper portion of the contact 150 is greater than the top width $W_{LT}$ of the lower portion of the contact 150. However, the top width $W_{UT}$ of the upper portion of the contact 150 may change to meet requirements, and the present disclosure is not limited thereto. The contact 150 illustrated in FIG. 9 is substantially similar to the contact 150 illustrated in FIG. 8, and the difference is the relationship of the top width $W_{LT}$ of the lower portion of the contact 150 and the top width $W_{UT}$ of the upper portion of the contact 150. In this embodiment, the top width $W_{UT}$ of the upper portion of the contact 150 is less than the top width $W_{LT}$ of the lower portion of the contact 150. However, the top width $W_{UT}$ of the upper portion of the contact 150 may change to meet requirements, and the present disclosure is not limited thereto.

Figure 10:
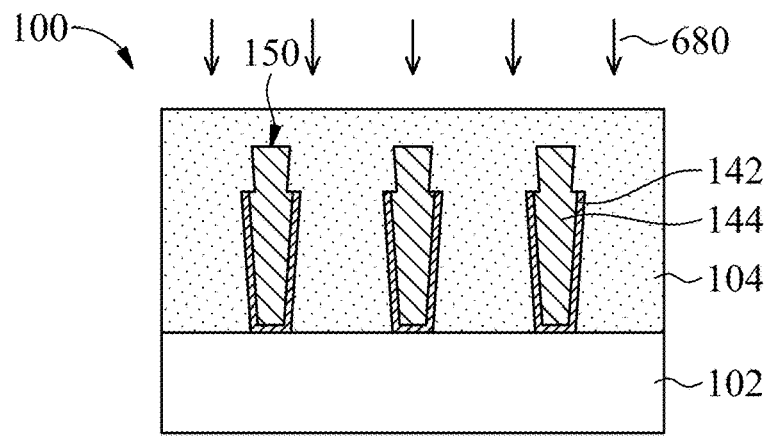
FIGS. 10-12 illustrate cross-sectional views of a semiconductor structure according to some embodiments of the present disclosure.

Next, referring back to FIG. 7, a deposition process 670 is performed to deposit another dielectric layer 104 on the contact 150 and the dielectric layer 104 previously formed on the substrate 102, as shown in FIG. 10. The deposition process 670 is similar to the deposition process 630, and thus the details are not described again herein to avoid repetition.

Figure 11:
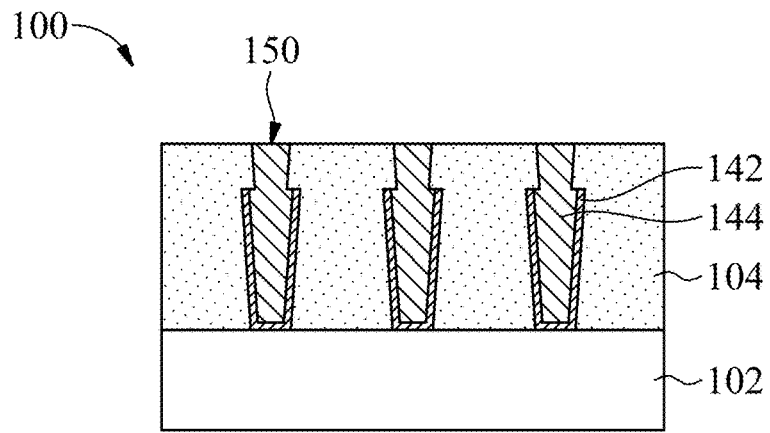

Next, a planarization process 680 is performed to remove the dielectric layer 104 on the contact 150, as shown in FIG. 11. The planarization process 680 is similar to the planarization process 640, and thus the details are not described again herein to avoid repetition.

In some embodiments, the liner 142 on the sidewalls of the upper portion of the contact 150 is completely etched away, and thus the sidewalls of the upper portion of the contact 150 is in direct contact with the dielectric layer 104, and the top of the lower portion also is in direct contact with the dielectric layer 104.

Figure 12:
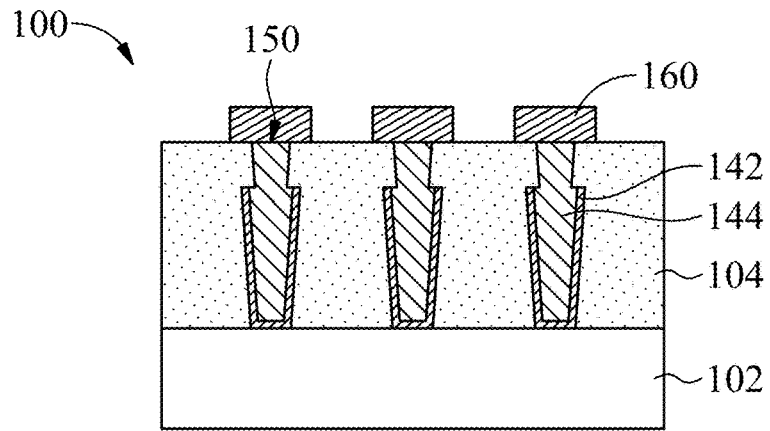
Figure 13:
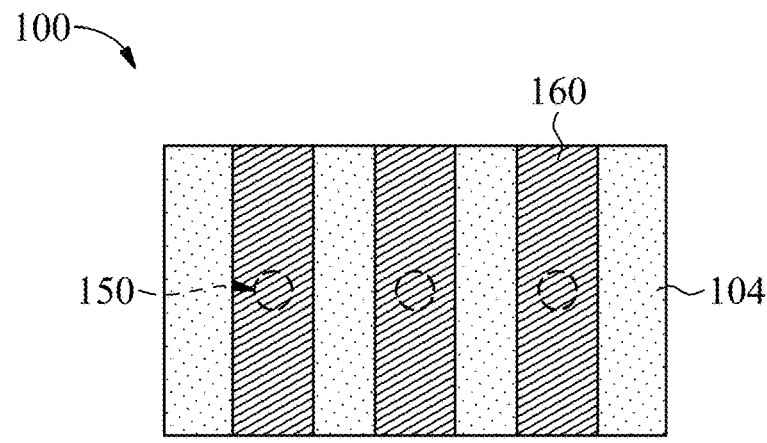
FIG. 13 illustrates a top view of a semiconductor structure corresponding to FIG. 12 according to some embodiments of the present disclosure.

Next, a conductive layer 160 is formed on the contact 150, as shown in FIG. 12. The top view of FIG. 12 is illustrated in FIG. 13. The materials and the deposition process for forming the conductive layer 160 may be similar to the conductive material 144 and the deposition process 630 above, and thus the details are not described again herein to avoid repetition. In this embodiment, after the conductive material is deposited, the conductive layer 160 may be formed through the lithography and etching processes. In other embodiments, the conductive layer may be formed by damascene process (not shown).

In the embodiment of FIG. 12, the conductive layer 160 is directly above the contact 150. In FIG. 13, the contact portion of the contact 150 and the conductive layer 160 is shown as a dashed line. That is, the topmost surface of the contact 150 is shown as a dashed line. In the embodiments of FIG. 13, the distances between the opposite sides of the conductive layer 160 and the contact are the same.

The contact formed in the prior art easily produces large scratch on the upper surface of the contact during the planarization process. However, in the present disclosure, the etching process 650 and the etching process 660 additionally used to recess the dielectric layer 104 and etch the upper portion of the contact 140 may etch away the scratch produced during the planarization process thereby improving the yield and the reliability.

Furthermore, if a smaller contact hole was formed directly in order to obtain a smaller top width of the contact, it is likely to form seams during the deposition of the conductive material. In comparison, in the present disclosure, a contact with a wider top width is formed first, followed by the isotropic etching process to reduce the top width of the contact. As such, a contact with a narrower top width may be obtained without the risk of forming seams, thereby increasing the process window.

In addition, in prior art, a single step or multiple steps of cleaning process (not shown) used after etching process for forming the contact may further increase the top width of the contact, causing short-circuits, as mentioned above. However, in the present disclosure, even if cleaning process is used after the etching process and thus the top width of the contact is wider than desired, a contact with a narrower top width may be formed using the method provided in the present disclosure, and thus the probability of short-circuits may be reduced.

Figure 14:
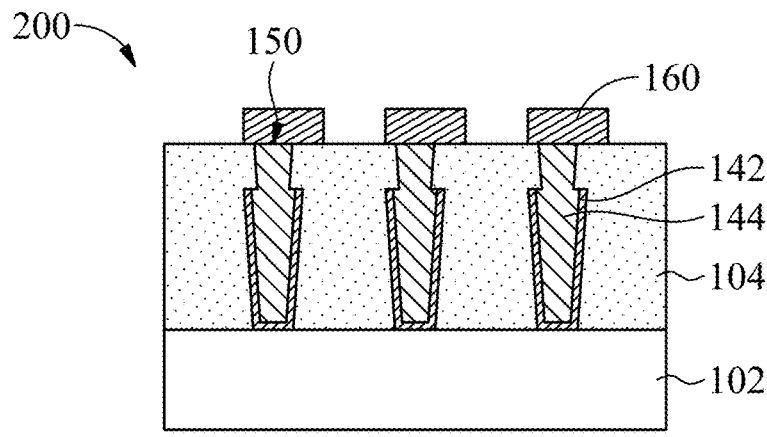
FIG. 14 illustrates a cross-sectional view of a semiconductor structure according to some embodiments of the present disclosure.
Figure 15:
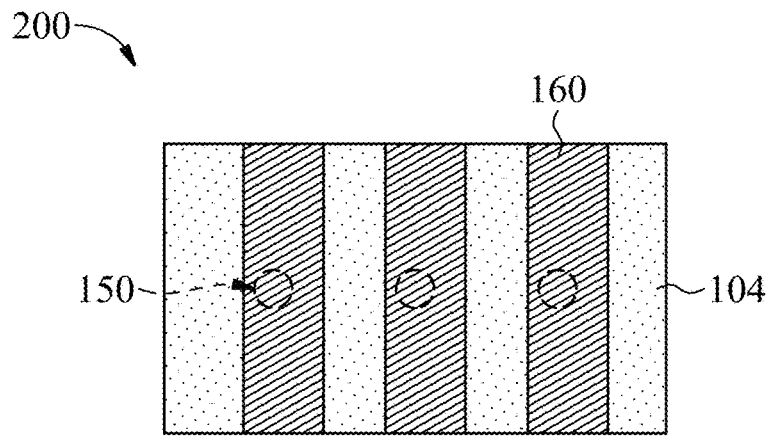
FIG. 15 illustrates a top view of a semiconductor structure corresponding to FIG. 14 according to some embodiments of the present disclosure.

FIGS. 14-15 illustrate a cross-sectional view and a corresponding top view of a semiconductor structure according to some embodiments of the present disclosure. The difference between the semiconductor structure 200 illustrated in FIG. 14 and the semiconductor structure 100 illustrated in FIG. 12 is that the conductive layer is not directly above the contact 150. In some embodiments, the middle line of the conductive layer 160 is offset from the middle line of the contact 150 by a distance. In FIG. 15, the distances between the contact 150 and opposite sides of the conductive layer 160 are different. In prior art, the contact 150 may be closer to the adjacent conductive layer 160, and thus short-circuits may occur. However, in the present disclosure, the top width of the contact is reduced and the distance between the contact and the adjacent conductive layer 160 is increased, thereby avoiding short-circuits.

Figure 16:
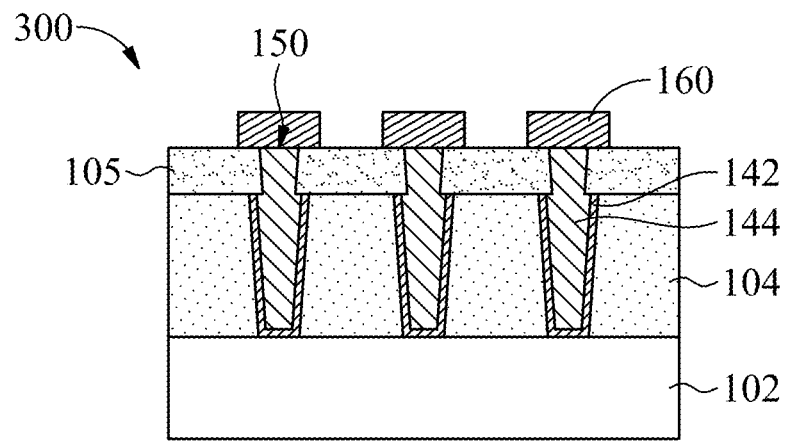
FIG. 16 illustrates a cross-sectional view of a semiconductor structure according to some embodiments of the present disclosure.

FIG. 16 illustrates a cross-sectional view of a semiconductor structure according to some embodiments of the present disclosure. The difference of the semiconductor structure 300 illustrated in FIG. 16 and the semiconductor structure 100 illustrated in FIG. 12 is that dielectric layer 105, which is different from the dielectric 104, is formed on the liner 142 and the dielectric layer 104. In this embodiment, dielectric layer 104 is level with the lower portion of the contact 150. Specifically, the dielectric layer 104 is level with the liner 142 and the portion of the conductive material 144. On the other hand, the dielectric layer 105 is level with the upper portion of the contact 150. Specifically, the dielectric layer 105 is level with the topmost surface of the contact 150. The materials of the dielectric 105 used are similar to but different from that of the dielectric layer 104, and thus the details are not described again herein to avoid repetition. The materials of the dielectric layer 104 and the dielectric 105 may be chosen and replaced depending on processes.

Figure 17:
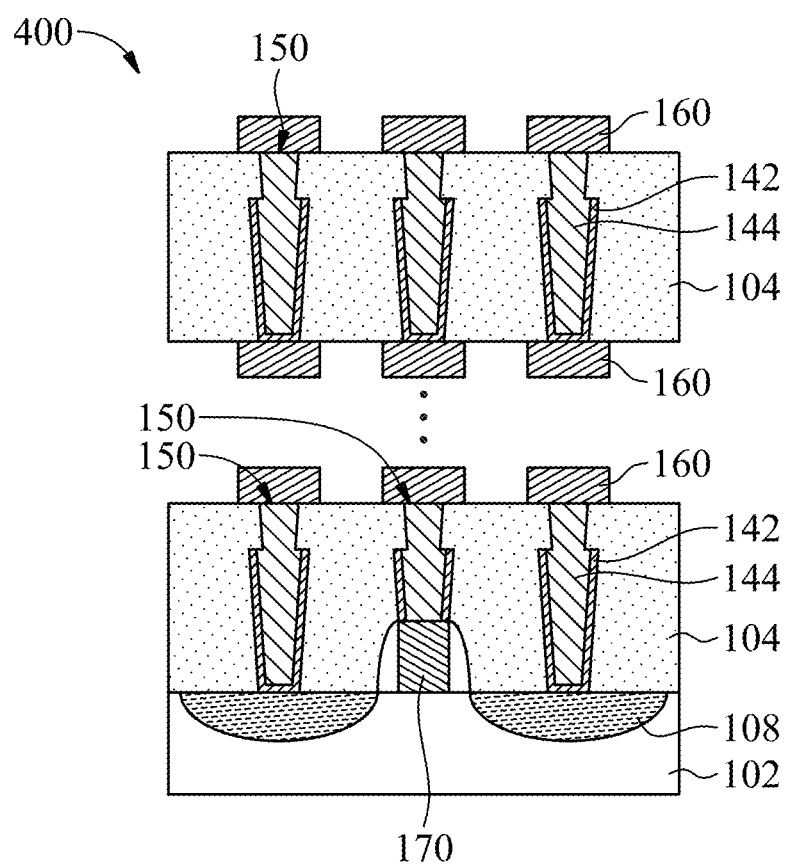
FIG. 17 illustrates a cross-sectional view of a semiconductor structure according to other embodiments of the present disclosure.

FIG. 17 illustrates a cross-sectional view of a semiconductor structure according to other embodiments of the present disclosure. The semiconductor structure 400 illustrated in FIG. 17 is an example applying the contact 150 in the semiconductor structure. In the embodiment of the front-end process, the contact 150 may serve as the source/drain contact plug formed between the source/drain 108 and the conductive layer 160. Alternatively, the contact 150 may serve as gate contact plug formed between the gate 170 and the conductive layer 160. In the embodiment of the back-end process, the contact 150 may serve as the via for vertical electrical connection formed between the conductive layer 160 and the conductive layer 160.

In summary, the semiconductor structure and the method for forming the same are provided by the present disclosure. Especially, a contact with a smaller top size will not only increase the process window but also improve yield and reliability.

What is claimed is:

1. A method for forming semiconductor device, comprising:
   forming a dielectric layer on a substrate;
   forming a contact in the dielectric layer, wherein the step of forming the contact comprises:
   forming a contact hole in the dielectric layer;
   conformally depositing a liner in the contact hole;
   depositing a conductive material in the contact hole and on the dielectric layer; and
   removing the conductive material outside the contact hole, while leaving the conductive material in the contact hole to serve as the contact;

recessing the dielectric layer, so that an upper portion of the contact protrudes from an upper surface of the dielectric layer; and etching the upper portion of the contact to reduce a size of the upper portion of the contact.

2. The method as claimed in claim 1, wherein the step of etching the upper portion of the contact comprises isotropically etching the upper portion of the contact.

3. The method as claimed in claim 2, wherein the step of etching the upper portion of the contact comprises isotropically etching sidewalls and a top surface of the upper portion of the contact to equally reduce a height and a width of the upper portion.

4. The method as claimed in claim 2, wherein the step of etching the upper portion of the contact comprises wet etching the upper portion of the contact.

5. The method as claimed in claim 1, wherein the dielectric layer is a first dielectric layer and after etching the upper portion of the contact, the method further comprises:

depositing a second dielectric layer on the first dielectric layer and the contact; and removing the second dielectric layer on the contact.

6. The method as claimed in claim 1, wherein the step of etching the upper portion of the contact comprises etching the liner on the upper portion of the contact.

7. The method as claimed in claim 1, wherein the top surface of the liner is exposed.

8. The method as claimed in claim 1, wherein the upper portion of the contact tapers toward the substrate after the etching.

9. The method as claimed in claim 1, wherein a top width of a lower portion of the contact is larger than a bottom width of the upper portion of the contact.

10. The method as claimed in claim 1, wherein the upper portion of the contact is exposed.

11. The method as claimed in claim 1, wherein an angle is formed between sidewalls of the upper portion and a top surface of the upper portion.

12. The method as claimed in claim 11, wherein the angle is 60°-90°.

13. The method as claimed in claim 1, wherein the sidewalls of the upper portion of the contact are parallel to the sidewalls of the lower portion of the contact.

* * * * *